US 6,618,838 B1

(12) United States Patent
Galpin

(10) Patent No.: US 6,618,838 B1
(45) Date of Patent: Sep. 9, 2003

(54) METHOD AND APPARATUS FOR PROCESSING AN OUTPUT OF A DESIGN TOOL

(75) Inventor: Darren Galpin, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/717,824

(22) Filed: Nov. 21, 2000

(30) Foreign Application Priority Data

Dec. 3, 1999 (GB) .......................................... 9928698.1

(51) Int. Cl.[7] .............................................. G06F 17/50
(52) U.S. Cl. .................... 716/4; 716/1; 716/2; 716/5; 716/10; 716/11; 716/18; 703/25; 703/14; 703/16; 703/28; 714/33; 714/41
(58) Field of Search .................... 716/1–21; 714/41, 714/724, 33; 707/564; 345/501; 703/14, 25, 28; 326/41; 365/189.12; 607/2

(56) References Cited

U.S. PATENT DOCUMENTS

| 5,519,627 A |   | 5/1996  | Mahmood et al. ........... 364/488 |
| 5,572,437 A | * | 11/1996 | Rostocker et al. ............ 716/18 |
| 5,841,663 A | * | 11/1998 | Sharma et al. ................. 716/18 |
| 5,953,519 A | * | 9/1999  | Fura ............................. 716/18 |
| 6,058,263 A | * | 5/2000  | Voth ............................. 703/25 |
| 6,182,268 B1 | * | 1/2001  | McElvain ....................... 716/1 |

FOREIGN PATENT DOCUMENTS

| EP | 0 404 482 | 12/1990 | ............ G06F/15/60 |
| EP | 0 507 535 | 10/1992 | ............ G01R/31/28 |
| WO | WO 01/35283 A2 | 5/2001 | |

OTHER PUBLICATIONS

Standard Search Report from file RS 104315.
British Search Report from British patent application No. 9928698.1, filed Dec. 3, 1999.

* cited by examiner

Primary Examiner—Vuthe Siek
Assistant Examiner—Helen Rossoshek
(74) Attorney, Agent, or Firm—Wolf, Greenfield & Sacks, P.C.; James H. Morris

(57) ABSTRACT

A method of, and apparatus for, processing the output of a design tool for an integrated circuit, the output relating to a circuit under design. A part of the circuit to be investigated is selected. Information relating to each signal in the selected part of the signal is then selected, and an output containing the selected information for the signals in the selected part of the circuit is generated.

22 Claims, 2 Drawing Sheets

METHOD AND APPARATUS FOR PROCESSING AN OUTPUT OF A DESIGN TOOL

The present invention relates to a method of processing the output of a test tool and, in particular, to a method of processing the output of a HDL tool or the like. The present invention also relates to apparatus for processing the output of a tool.

Generally, integrated circuits (IC) are tested prior to their reduction to silicon. In this way, the overall development time for an integrated circuit can be reduced considerably. In practice, this means that an IC device can be brought to market more quickly. A number of test simulators are known which allow test departments to test how a device will function as soon as a preliminary design is completed. This can be prior to the reduction to silicon of the device.

When analyzing a circuit, the circuit is divided up into a number of smaller units, usually referred to as cells. Each cell will typically include a number of different components, such as gates, other logic elements or the like. Typically, an integrated circuit will comprise a large number of cells, such as many thousands or hundreds of thousands of cells.

To describe circuits on such a large scale, digital simulators have been developed. Numerous digital simulators have been developed to model the behavior of circuitry described using a hardware description language (HDL). HDL is a programming language which has been designed and optimized for simulating and thereby describing the behaviour of digital circuitry. HDL allows electrical aspects of circuit behaviour to be precisely described. In HDL, changes in a logic level trigger an evaluation of the effect.

HDL models typically provide a behavioural description of the circuitry of the designed device which can be synthesized into a net list which includes circuit diagrams of the device saved in textural form. In other words, the circuitry of the device is broken down into cells or small circuit portions, each of which has a known, behavior. These cells or small circuit portions are listed in the net list. Operation of the device is simulated by stimulating the net list by the application of a test bench. Test benches are HDL descriptions of circuit stimulus. The outputs of the cell in response to stimulus are compared with expected outputs to verify the, behavior of a circuit over time. The verification results may be analyzed to establish the circuit has functioned.

Most HDL simulators are able to generate output files which include the results of a simulation of a cell. The output files include information relating to individual elements of a cell. In particular, the files include waveforms. The waveforms, when viewed using the simulator are graphical representations of what the signals do over time. The information contained in the output files can be viewed by the user of the tool and compared with a reference set of information or other type of information. Included in a given file is all the information relating to a given cell. If the user of the tool wants to consider only part of a cell, it is difficult for the user to achieve this based on the files output by the tool It is therefore an aim of embodiments of the present invention to address this difficulty.

According to a first aspect of the present invention there is provided a method of processing the output of a design tool, said output relating to a circuit under design, said method comprising the steps of selecting a part of said circuit: selecting information relating to each signal in the selected part of the circuit; and providing an output containing the selected information for the signals in the selected part of the circuit.

According to a second aspect of the present invention there is provided apparatus for processing the output of a design tool, said output relating to a circuit under design, said apparatus comprising means for defining a part of the circuit; means for selecting information for the signals in the selected part of the circuit; and means for providing an output containing the information relating to the selected signals.

An embodiment of the present invention will now be described by way of example only with reference to the accompanying drawings in which.

Figure 1:
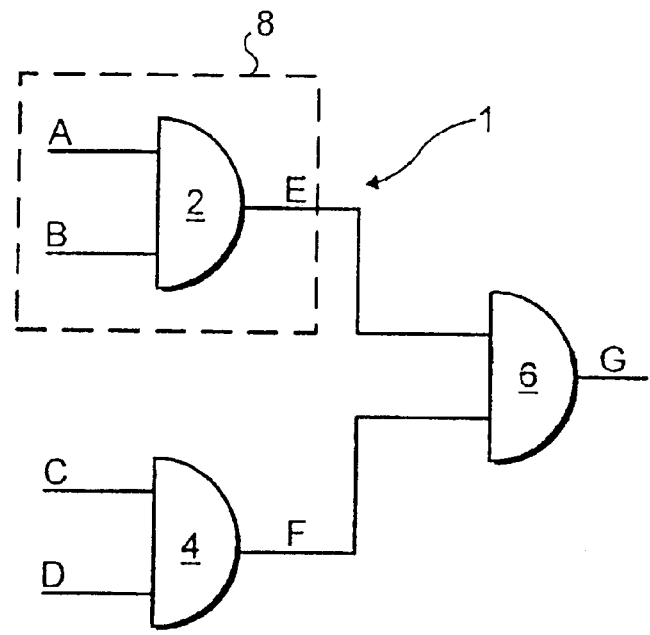
FIG. 1 shows an example of a cell of an integrated circuit.

Referring to FIG. 1, the cell under test is a simple circuit for illustrative purposes only. In practice, the cell may include many more elements. The cell 1 shown in FIG. 1 comprises three AND gates 2, 4 and 6. The first AND gate 2 has a first input A and a second input B. The output E of the first AND gate 2 is input to one of the inputs of the third AND gate 6.

The second AND gate 4 has a first input C and a second input D. The output of the second AND gate F is connected to the second input of the third AND gate 6. The output of the third AND gate is output G.

Figure 2:
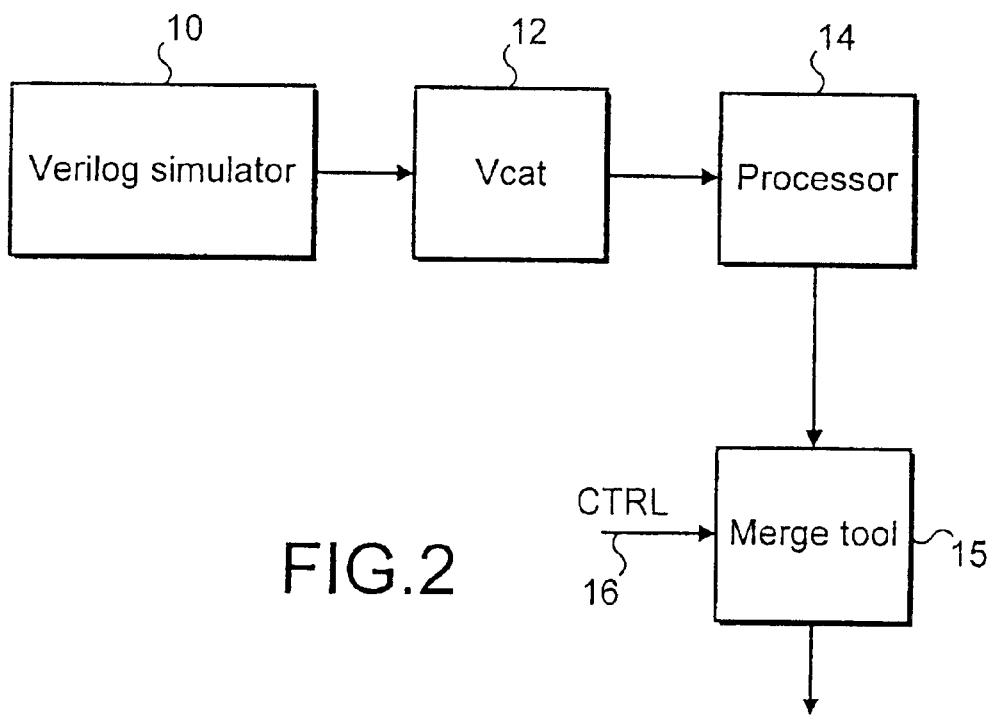
FIG. 2 shows a system embodying the present invention.

Referring next to FIG. 2, a Verilog simulator is used. In one embodiment the VCS tool from Synopsys and IKOS Gemini tool were used. However any other tool may be used. Verilog is an HDL language defined to an IEEE standard. It should be appreciated that in alternative embodiments of the present invention, the simulator may be a HDL simulator made by any other party.

Verilog is an example of HDL. Verilog supports many abstract data types which are used to describe different signal strengths or commonly used simulation conditions such as unknowns and high impedance conditions. These non standard data types have been adopted by the IEEE as standard number 1364.

Verilog can describe the behavior and structure of electronic systems in general and is suited as a language to describe the structure and behavior of digital electronic hardware designs, such as hardware cells. A cell is typically a relatively small part of the overall circuit design. Such device design is described in Verilog using the concept of a module. Each module describes the external interface or connections to the module together with a representation of the internal description of the module such as its structure, behavior or both.

The HDL simulator provides for the cell in question, for example the arrangement shown in FIG. 1, a Verilog change dump (VCD) output file. A VCD file is an ASGII file which includes waveform data. This file can be displayed with a viewer in a graphical form to allow the user of the tool to view the wave forms. These wave forms contain the data necessary to generate a set of vectors which can then be used to simulate individual blocks in the cell in isolation rather than simulating the entire cell. In other words, for the cell shown in FIG. 1, information on signals on the inputs A to D and outputs E to G would be available. However, if the user of the tool wanted to look at a small part of the cell in detail, possibly to resolve a problem or the like with the cell, it is not very easy for the user of the tool to consider only the inputs A and B and the output E.

The output of the Verilog simulator 10, that is the VCD output file, is input to a Vcat tool. The tool displays the VCD file, in a more humanly readable format which is a text file.

In one embodiment of the present invention, the tool 12 is the Vcat tool supplied by a company called Synopsys. The Vcat tool 12 displays the VCD output file in an ASCII format. The tool is able to generate outputs for part of the cell which give the time, signal name and signal change at a particular time. For example, time intervals can be specified. In one embodiment of the present invention time intervals are specified. For the first time interval at 0ns, the Vcat tool determines if any of the signals A to G have changed and if so displays the name of the signal and how it is changed. This process is continued for each consecutive time period. An example of typical results are as follows:

0 ns: A=0
10 ns: B=1, C=1

In the example given, in the first time period at 0ns, signal A has changed to "0", none of the other signals changing. In the second time interval at 10 ns, signal B and signal C have changed to "1", none of the other signals changing.

In this embodiment, the time interval is 10 ns. Of course any other time interval can be used. It is also not essential that the time intervals be regularly spaced.

This information is output to a processor 14. This processor 14 generates for each signal a separate file. In other words, a separate file is generated for each of signals A to G. Each file contains information as to at what time that signal changed and how it changed. In the example shown in relation to FIG. 1, seven separate files are generated. The processor can use any suitable tool in order to generate these files. Examples of these tools are GREP, SED and AWK tools which are all UNIX tools.

In preferred embodiments of the present invention, these files are WIF files. A WIF (waveform interface format) file is an ASCII based file which contains information needed to describe the models interface (names of ports, directions of signals, for example input/output/bi-directional), types of signals and signal activity against time in a tabular format.

These separate files are input to a merge tool 15 which, in embodiments of the present invention can be a wif2tb tool. This tool receives the nine files and also a control input. This control input 16 allows the user to select a part of the cell of FIG. 1. By way of example the part 8 of the cell 1 containing the first AND gate 2 is selected. The control signal causes the merge tool to select the WIF files for signals A, B and E. These files are merged together to provide a single set of vectors. In particular, a vector is generated for each time interval. In the case of the example shown in FIG. 1, a vector having three values is generated, containing the value of A, B and E for a given time interval. These vectors can either represent a change in the state of the signal A, B and E or the current value of the signals A, B and E in the given time period. The vector for a given time is used to simulate the part 8 of the circuit. The vectors for the different time period are successively used to simulate the part of the circuit.

Thus, using the set of vectors generated by the merge tool 15, the part 8 of the circuit 1 can be separately simulated. In particular, any part of the circuit can be tested by changing the levels of the signals extracted from the VCD file.

Figure 3:
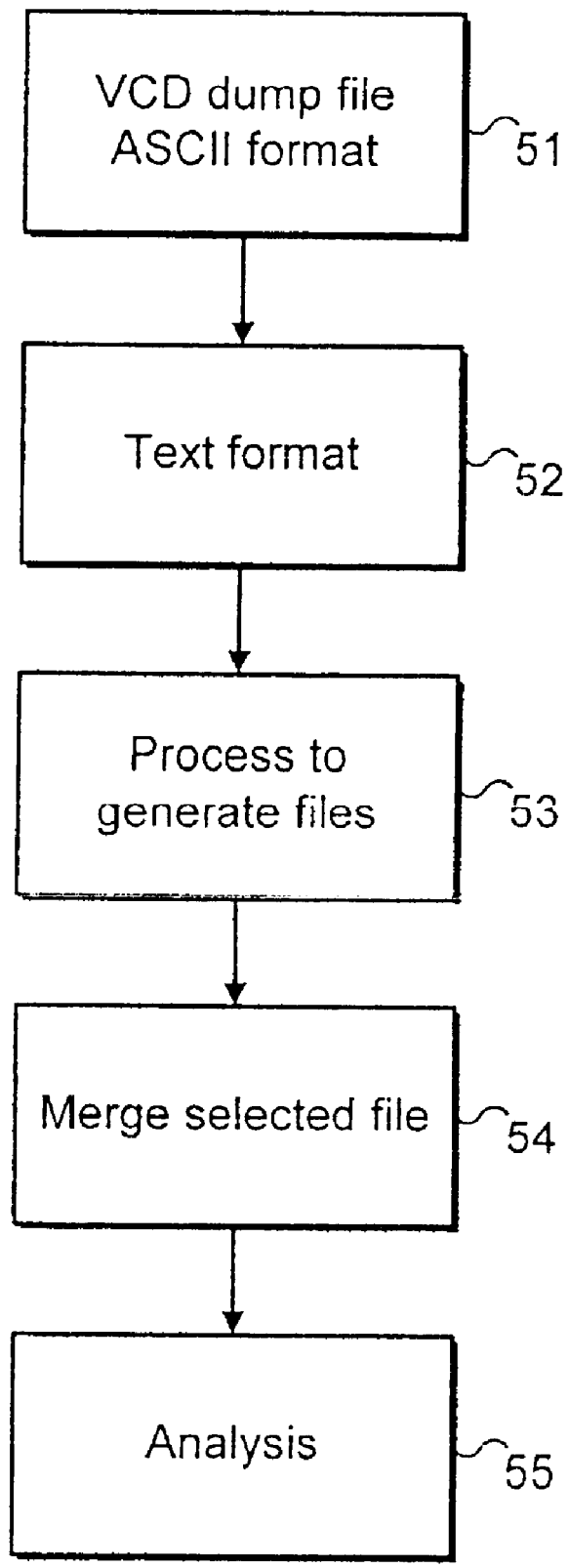
FIG. 3 shows a flow chart of the method embodying the present invention.

Reference is made to FIG. 3 which shows the steps employed by the apparatus of FIG. 2.

In step S1 the VCD dump file is provided in ASCII format.

In step S2, the VCD dump file is converted to a more usable format by the Vcat tool 12.

In step S3, the processor 14 processes the output from the Vcat tool 12 to generate separate files for each signal of the cell.

In step S4, selected ones of the file are merged together to provide a description of part 8 of the cell 1.

In step S5, the merged selected files are analysed or tested by changing the level of the signals which are extracted from the VCD file.

It should be appreciated that in embodiments of the present invention, any suitable time interval may be used by the processor 14. In alternative embodiments of the present invention, the time when a signal changes is recorded instead of checking the state of a signal at regular time intervals. It is also possible in alternative embodiments of the invention that the state of the signals be recorded for each time period regardless of whether or not the signals change.

Embodiments of the present invention may be implemented by a computer program or by suitable circuitry.

The output of embodiments of the present invention provide an indication to a user, for example on a display, indicating whether a test has failed or passed for a particular part of the cell. Optionally, in the case of failure, an explanation may be provided as to the cause of the failure. The output may also advise the computer operating system if the test has passed or failed. In a preferred embodiment of the invention, a file is created in the operating system which indicates if a test has passed or failed. In the case of failure, the reason for failure may be written to the file.

In embodiments of the present invention described hereinbefore, the part of the circuit which is considered is part of the cell. However, in alternative embodiments of the present invention, where there are no cells as such, the same technique can be used to consider parts of the circuit as a whole.

It should be appreciated that while embodiments of the present invention have used a Verilog tool, embodiments of the present invention can use any other HDL or non HDL tool.

Embodiments of the present invention may be used with digital or analog tools. Embodiments of the present invention are particularly applicable to those tools which provide information about a cell or the like and a user wishes to look at only a part of the cell or the like. Embodiments of the invention allow the user to determine information about only part of the circuit or cell. This allows a user to more easily change the design and/or remove errors.

Embodiments of the present invention are particularly applicable to design tools. The design tool may be a test tool or a tool which provides a design.

Embodiments of the present invention can be used with tools other than the Vcat tool. In one modification to the present invention, the processor additionally provides the function of the Vcat tool and extracts the required information from the output of the Verilog simulator.

In alternative embodiments of the invention, the information relating only to the signals, which are in the part of the circuit are extracted from the output of the Verilog tool. The remaining signals are not extracted. The signals for the part of the circuit or cell may be provided in a single file, avoiding the need to merge the files.

Embodiments of the present invention are particularly applicable where a cell or circuit is tested and information about part of the cell or circuit is required without having to perform a further test. Thus the test data from a previous test run can be used in embodiments of the present invention. It is therefore possible to extract target test data from general test data.

What is claimed is:

1. A method of processing an output of a design tool, said output comprising the results of a test relating to a circuit under design, said method comprising acts of:

selecting a part of said circuit under design;

selecting separate information relating to each signal in the selected part of the circuit, the separate information being selected from said output comprising the results of the test relating to the circuit under design, said output being provided by said design tool;

providing an output containing the selected information for the signals in the selected part of the circuit; and processing said output of the results of the test relating to the circuit under design from said output of said design tool to define said separate information for each signal in said circuit.

2. A method as claimed in claim 1, wherein said separate information for each signal in the circuit under design is provided in a file.

3. A method as claimed in claim 2, wherein the files relating to the signals of the selected part of the circuit are combined.

4. A method as claimed in claim 1, wherein said output information is displayed.

5. A method as claimed in claim 1, wherein said information comprises information relating to the state of the signals.

6. A method as claimed in claim 5, wherein said information comprises information relating to a plurality of changes in the states of the signals.

7. A method as claimed in claim 1, wherein said information is provided for the signals over a predetermined period of time.

8. A method as claimed in claim 7, wherein said information is provided for a plurality of time intervals.

9. A method as claimed in claim 1, wherein said design tool is a Verilog tool.

10. The method as recited in claim 1, further comprising representing the circuit by a plurality of cells, and wherein the act of selecting comprises an act of selecting at least one of the plurality of cells.

11. The method as recited in claim 10, wherein at least one of the plurality of cells includes one or more components of the circuit, wherein the act of selecting at least one of the plurality of cells comprises an act of selecting the one or more components of the circuit, and wherein the act of providing an output includes providing an output that only includes information relating to the one or more selected components.

12. An apparatus for processing the output of a design tool, said output comprising the results of a test relating to a circuit under design, said apparatus comprising:

means for defining a part of the circuit;

means for selecting separate information for the signals in the selected part of the circuit, wherein the separate information is selected from said output comprising the results of the test relating to the circuit under design, said output being provided by said design tool;

means for providing an output containing the selected information for the signals; and means for processing said output of the results of the test relating to the circuit under design from said output of said design tool to define said separate information for each signal in said circuit.

13. The apparatus as recited in claim 12, wherein said separate information for each signal in the circuit under design is provided in a file.

14. The apparatus as recited in claim 13, wherein the files relating to the signals of the selected part of the circuit are combined.

15. The apparatus as recited in claim 12, wherein said output information is displayed.

16. The apparatus as recited in claim 12, wherein said information comprises information relating to the state of the signals.

17. The apparatus as recited in claim 15, wherein said information comprises information relating to a plurality of changes in the states of the signals.

18. The apparatus as recited in claim 12, wherein said information is provided for the signals over a predetermined period of time.

19. The apparatus as recited in claim 18, wherein said information is provided for a plurality of time intervals.

20. The apparatus as recited in claim 12, wherein said design tool is a Verilog tool.

21. The apparatus as recited in claim 12 further comprising means for representing the circuit by a plurality of cells, and wherein said means for selecting comprises means for selecting at least one of the plurality of cells.

22. The apparatus as recited in claim 21, wherein at least one of the plurality of cells includes one or more components of the circuit, wherein said means for selecting at least one of the plurality of cells comprises means for selecting the one or more components of the circuit, and wherein said means for providing an output includes means for providing an output that only includes information relating to the one or more selected components.

* * * * *